US012575145B2

(12) United States Patent
Zhang et al.

(10) Patent No.: US 12,575,145 B2
(45) Date of Patent: Mar. 10, 2026

(54) MONOLITHIC STACKED FIELD EFFECT TRANSISTOR (SFET) WITH DUAL MIDDLE DIELECTRIC ISOLATION (MDI) SEPARATION

(71) Applicant: International Business Machines Corporation, Armonk, NY (US)

(72) Inventors: Jingyun Zhang, Albany, NY (US); Ruilong Xie, Niskayuna, NY (US); Julien Frougier, Albany, NY (US); Ruqiang Bao, Niskayuna, NY (US); Prabudhya Roy Chowdhury, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 17/936,417

(22) Filed: Sep. 29, 2022

(65) Prior Publication Data

US 2024/0113162 A1 Apr. 4, 2024

(51) Int. Cl.
H10D 30/43 (2025.01)
H10D 30/01 (2025.01)
(Continued)

(52) U.S. Cl.
CPC ......... H10D 62/121 (2025.01); H10D 30/014 (2025.01); H10D 30/43 (2025.01);
(Continued)

(58) Field of Classification Search
None
See application file for complete search history.

(56) References Cited

U.S. PATENT DOCUMENTS

| | | | |
|---|---|---|---|
| 10,192,819 B1 | 1/2019 | Chanemougame et al. | |
| 10,192,867 B1 | 1/2019 | Frougier et al. | |
| (Continued) | | | |

FOREIGN PATENT DOCUMENTS

| | | | |
|---|---|---|---|
| EP | 4261873 A2 | 10/2023 | |
| EP | 4270460 A1 | 11/2023 | |
| EP | 4270464 A1 | 11/2023 | |

OTHER PUBLICATIONS

International Search Report; International Application No. PCT/EP2023/076182; International Filing Date: Sep. 22, 2023; Date of mailing: Jan. 5, 2024; 15 pages.

*Primary Examiner* — Xiaoming Liu
(74) *Attorney, Agent, or Firm* — Cantor Colburn LLP; Kristofer Haggerty

(57) ABSTRACT

Embodiments of the present invention are directed to monolithic stacked field effect transistor (SFET) processing methods and resulting structures having dual middle dielectric isolation (MDI) separation. In a non-limiting embodiment of the invention, a first nanosheet is formed and a second nanosheet is vertically stacked over the first nanosheet. A gate is formed around a channel region of the first nanosheet and a channel region of the second nanosheet and a middle dielectric isolation structure is formed between the first nanosheet and the second nanosheet. The middle dielectric isolation structure includes a first middle dielectric isolation layer and a second middle dielectric isolation layer vertically stacked over the first middle dielectric isolation layer. A portion of the gate extends between the first middle dielectric isolation layer and the second middle dielectric isolation layer in the middle dielectric isolation structure.

10 Claims, 13 Drawing Sheets

100

(51) Int. Cl.

| | |
|---|---|
| *H10D 30/67* | (2025.01) |
| *H10D 62/10* | (2025.01) |
| *H10D 84/01* | (2026.01) |
| *H10D 84/03* | (2025.01) |

(52) U.S. Cl.
CPC ..... *H10D 30/6757* (2025.01); *H10D 84/0167* (2025.01); *H10D 84/017* (2025.01); *H10D 84/0188* (2025.01); *H10D 84/038* (2025.01)

(56) References Cited

U.S. PATENT DOCUMENTS

| | | | | |
|---|---|---|---|---|
| 10,256,158 | B1 | 4/2019 | Frougier et al. | |
| 10,741,456 | B2 | 8/2020 | Cheng et al. | |
| 11,158,738 | B2 | 10/2021 | Wang et al. | |
| 11,195,832 | B2 | 12/2021 | Gardner et al. | |
| 11,201,153 | B2 | 12/2021 | Xie et al. | |
| 2011/0254013 | A1* | 10/2011 | Xiao | H10D 30/6735 |
| | | | | 257/369 |
| 2020/0266218 | A1* | 8/2020 | Lilak | H10D 30/014 |
| 2020/0294998 | A1 | 9/2020 | Lilak et al. | |
| 2020/0403034 | A1* | 12/2020 | Ando | H10N 70/8833 |
| 2022/0157936 | A1 | 5/2022 | Khaderbad et al. | |
| 2022/0165730 | A1 | 5/2022 | Chen et al. | |
| 2022/0216340 | A1 | 7/2022 | Lin et al. | |

* cited by examiner

1300

1302 —— | Form a first nanosheet |

1304 —— | Form a second nanosheet vertically stacked over the first nanosheet |

1306 —— | Form a gate around a channel region of the first nanosheet and a channel region of the second nanosheet |

1308 —— | Form a middle dielectric isolation structure having two or more layers between the first nanosheet and the second nanosheet |

MONOLITHIC STACKED FIELD EFFECT TRANSISTOR (SFET) WITH DUAL MIDDLE DIELECTRIC ISOLATION (MDI) SEPARATION

BACKGROUND

The present invention generally relates to fabrication methods and resulting structures for semiconductor devices, and more specifically, to processing methods and resulting structures for a monolithic stacked field effect transistor (SFET) with a dual middle dielectric isolation (MDI) separation.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, GAA transistors (also referred to as nanosheet FETs and nanowire FETs) include a non-planar architecture that provides increased device density and some increased performance over lateral devices. In nanosheet FETs, in contrast to conventional planar FETs, the channel is implemented as a plurality of stacked and spaced-apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL). As MOSFET fabrication continues to develop, stacked FET architectures are being investigated to meet aggressive gate length (Lg) scaling requirements and current drive capabilities. In a stacked FET, two (or more) FETs are vertically stacked over a substrate to reduce the overall device footprint.

SUMMARY

Embodiments of the invention are directed to a method for forming a stacked semiconductor device having a dual middle dielectric isolation (MDI) separation. A non-limiting example of the method includes forming a first nanosheet and a second nanosheet vertically stacked over the first nanosheet. A gate is formed around a channel region of the first nanosheet and a channel region of the second nanosheet and a middle dielectric isolation structure is formed between the first nanosheet and the second nanosheet. The middle dielectric isolation structure includes a first middle dielectric isolation layer and a second middle dielectric isolation layer vertically stacked over the first middle dielectric isolation layer. A portion of the gate extends between the first middle dielectric isolation layer and the second middle dielectric isolation layer in the middle dielectric isolation structure.

In some embodiments, the method further includes forming a first nanosheet stack that includes the first nanosheet and one or more additional nanosheets and a second nanosheet stack that includes the second nanosheet and one or more additional nanosheets, enabling a stacked transistor architecture having any number of channels.

In some embodiments, the semiconductor device is a stacked field effect transistor having a reduced footprint relative to non-stacked architectures. In some embodiments, the gate is a common gate of the stacked field effect transistor. In some embodiments, the gate includes a first portion (i.e., a first gate) and a second portion (i.e., a second gate) electrically isolated from the first portion. In some embodiments, the first portion serves as a gate for the first nanosheet and the second portion serves as a separate gate for the second nanosheet.

In some embodiments, the stacked field effect transistor includes a stacked pFET and nFET, enabling a complementary stacked field effect transistor structure. In some embodiments, the first nanosheet stack defines a portion of one of the nFET and the pFET and the second nanosheet stack defines a portion of the other one of the nFET and the pFET.

In some embodiments, the method further includes forming a first source or drain region in direct contact with sidewalls of the first nanosheet and forming a second source or drain region in direct contact with sidewalls of the second nanosheet. In some embodiments, a middle interlayer dielectric is formed between the first source or drain region and the second source or drain region. The middle interlayer dielectric can be in direct contact with sidewalls of the first middle dielectric isolation layer and sidewalls of the second middle dielectric isolation layer, ensuring isolation between stacked FETs in the final device. In some embodiments, the first source or drain region includes a first doping type (e.g., n-type or p-type) and the second source or drain region includes a second doping type opposite the first doping type (e.g., p-type or n-type), allowing for complementary transistor architectures (e.g., CMOS).

In some embodiments, a thickness of the first middle dielectric isolation layer and a thickness of the second middle dielectric isolation layer is less than or equal to 10 nanometers. Advantageously, limiting the thickness of each middle dielectric isolation layer according to one or more embodiments avoids epitaxy-related defects, improving the performance and reliability of the final device.

Embodiments of the invention are directed to a semiconductor structure. A non-limiting example of the semiconductor structure includes a first nanosheet and a second nanosheet vertically stacked over the first nanosheet. A gate is formed around a channel region of the first nanosheet and a channel region of the second nanosheet. A middle dielectric isolation structure is formed between the first nanosheet and the second nanosheet. The middle dielectric isolation structure includes a first middle dielectric isolation layer and a second middle dielectric isolation layer vertically stacked over the first middle dielectric isolation layer. A portion of the gate extends between the first middle dielectric isolation layer and the second middle dielectric isolation layer in the middle dielectric isolation structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figures 1A, 1B:
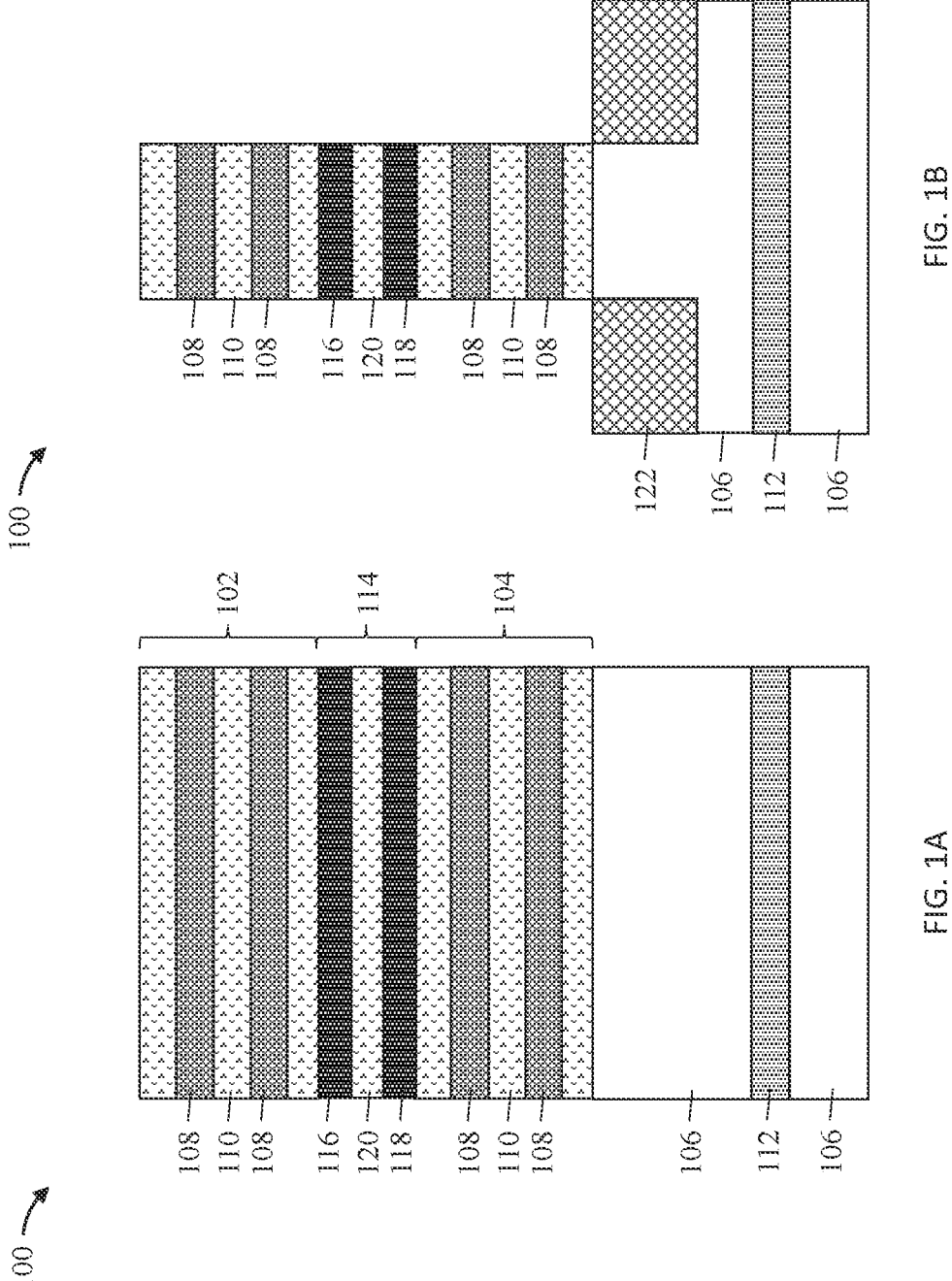
FIG. 1A depicts a first cross-sectional view (across gate in a channel region) of a semiconductor wafer after an initial set of processing operations according to one or more embodiments of the invention.
FIG. 1B depicts a second cross-sectional view (along gate in a channel region) of the semiconductor wafer of FIG. 1A after the initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain)

of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

There are several nonplanar transistor architectures for scaling transistors beyond the 7 nm node, but each is currently limited due to various factors. One such architecture is the so-called stacked field effect transistor (FET). To increase the available computing power per unit area, stacked FET devices (or SFETs) vertically stack two (or more) FETs over a shared substrate footprint. The resultant stacked transistor architecture offers several improvements over planar and fin-type devices, such as the ability to build complementary devices (e.g., CMOS) at a reduced footprint. SFET fabrication is challenging, however, and efforts are ongoing to design SFET fabrication schemes and structures that are suitable for scaled production.

Monolithic SFET formation, for example, builds two (or more) FETs monolithically, that is, continuously from a common stack of semiconductor and sacrificial layers. This is in contrast to other SFET formation techniques, where two wafers are processed separately (i.e., semiconductor stacks are built on each wafer) and later joined via a wafer bonding process. For monolithic SFET formation, one of the key challenges is providing a wider separation between the top FET and the bottom FET. Without sufficient separation, top to bottom source/drain epitaxy shorts, work function metal (WFM) patterning undercuts, and other structural issues can emerge. The top FET and the bottom FET are electrically isolated from each other via a middle dielectric isolation (MDI) layer. The thickness of this layer corresponds to the thickness of a middle sacrificial layer in the common stack. Unfortunately, directly increasing the middle sacrificial layer thickness (above, e.g., about 10 nanometers) causes inner spacer shape and uniformity issues as well as epitaxy defects.

Turning now to an overview of aspects of the present invention, one or more embodiments of the invention address the above-described shortcomings by providing monolithic SFET fabrication methods and resulting structures having dual middle dielectric isolation (MDI) layers (also referred to as bi-layer MDI separation). Advantageously, each MDI layer can be formed to a thickness of less than 10 nanometers while still providing an overall separation greater than 10 nanometers between the top FET and the bottom FET.

Monolithic SFETs fabricated according to one or more embodiments largely avoid the fabrication and structural issues associated with relatively thick (e.g., greater than about 10 nanometers) middle sacrificial layers. In some embodiments, a middle interlayer dielectric (ILD) is positioned between the top and bottom source/drain epitaxies that abuts the MDI layers. The middle ILD supports the MDI layers in preventing top to bottom source/drain epitaxy shorts. Moreover, while aspects of the invention are primarily discussed with respect to bi-layer MDI separations for convenience, the number of MDI layers need not be so limited. In some embodiments, an arbitrary number of MDI layers can together define a multi-layer MDI separation having an arbitrarily high total thickness, while ensuring that all component MDI layers have a bound thickness, such as, for example, a thickness below 10 nanometers.

Turning now to a more detailed description of fabrication operations and resulting structures according to aspects of the invention, FIG. 1A depicts a first cross-sectional view (across gate in a channel region) of a semiconductor wafer 100 after an initial set of fabrication operations have been applied as part of a method of fabricating a final semiconductor device according to one or more embodiments of the invention. FIG. 1B depicts a second cross-sectional view (along gate in the channel region) of the semiconductor wafer 100 of FIG. 1A.

As shown in FIG. 1A, a first nanosheet stack 102 is formed over a second nanosheet stack 104. The first nanosheet stack 102 and the second nanosheet stack 104 are together formed over a substrate 106. In some embodiments, the first nanosheet stack 102 and the second nanosheet stack 104 each include one or more nanosheets 108 alternating with two or more sacrificial layers 110. In some embodiments, the nanosheets 108 and the sacrificial layers 110 are epitaxially grown layers. For ease of discussion reference is made to operations performed on and to nanosheet stacks having two nanosheets (e.g., the two nanosheets 108 of the first nanosheet stack 102 and the second nanosheet stack 104, respectively, shown in FIG. 1A) alternating with three sacrificial layers (e.g., the three sacrificial layers 110 of the first nanosheet stack 102 and the second nanosheet stack 104, respectively, shown in FIG. 1A). It is understood, however, that the first nanosheet stack 102 and the second nanosheet stack 104 can include any number of nanosheets alternating with a corresponding number of sacrificial layers. For example, the nanosheet stacks 102, 104 can include two nanosheets, five nanosheets, eight nanosheets, 30 nanosheets (e.g., 3D NAND), or any number of nanosheets, along with a corresponding number of sacrificial layers (i.e., as appropriate to form a nanosheet stack having a topmost sacrificial layer, a bottommost sacrificial layer, and a sacrificial layer between each pair of adjacent nanosheets). Moreover, it is not necessary that the first nanosheet stack 102 and the second nanosheet stack 104 have a same number of nanosheets 108, and other configurations having any distribution of nanosheets is within the contemplated scope of this disclosure.

The nanosheets 108 and the substrate 106 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlInAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. The nanosheets 108 and the substrate 106 can be made of the same, or different, semiconductor materials. In some embodiments, the nanosheets 108 have a thickness of about 5 nm to about 15 nm, for example 10 nm, although other thicknesses are within the contemplated scope of this disclosure.

In some embodiments, the substrate 106 is structured as a silicon-on-insulator (SOI) substrate having a buried oxide layer 112. The buried oxide layer 112 can be made of any suitable material, such as, for example, silicon oxide ($SiO_2$) or silicon germanium. In some embodiments, the buried oxide layer 112 is formed to a thickness of about 10-200 nm, although other thicknesses are within the contemplated scope of this disclosure.

The sacrificial layers 110 can made of silicon, silicon germanium, or other semiconductor materials, depending on the material of the nanosheets 108, to meet etch selectivity requirements. For example, in embodiments where the nanosheets 108 are silicon nanosheets, the sacrificial layers 110 can be silicon germanium layers. In embodiments where the nanosheets 108 are silicon germanium nanosheets, the sacrificial layers 110 can be silicon layers or silicon germanium layers having a germanium concentration that is greater than the germanium concentration in the nanosheets 108. For example, if the nanosheets 108 are silicon germanium having a germanium concentration of 5 percent (sometimes referred to as SiGe5), the sacrificial layers 110 can be silicon germanium layers having a germanium concentration of 25 percent (SiGe25), although other germanium concentrations are within the contemplated scope of this disclosure. In some embodiments, the sacrificial layers 110 have a thickness of about 5 nm to about 12 nm, for example 10 nm, although other thicknesses are within the contemplated scope of this disclosure.

In some embodiments, the first nanosheet stack 102 and the second nanosheet stack 104 are separated by an isolation structure 114. The isolation structure 114 can include a top sacrificial layer 116, a bottom sacrificial layer 118, and a middle sacrificial layer 120 between the top sacrificial layer 116 and the bottom sacrificial layer 118. In some embodiments, the middle sacrificial layer 120 is made of a same material as sacrificial layers 110, although other materials are possible.

Materials for the top sacrificial layer 116 and the bottom sacrificial layer 118 are selected to ensure etch selectivity with respect to the nanosheets 108, the sacrificial layers 110, and the middle sacrificial layer 120. For example, in embodiments where the nanosheets 108 are silicon nanosheets and the sacrificial layers 110, 120 are SiGe30 layers, the top sacrificial layer 116 and the bottom sacrificial layer 118 can be SiGe55 layers, although other germanium concentrations are within the contemplated scope of this disclosure. In some embodiments, the top sacrificial layer 116 and the bottom sacrificial layer 118 are formed to a thickness of no more than 10 nanometers, although other thicknesses are within the contemplated scope of this disclosure.

As shown in FIG. 1B, the first nanosheet stack 102 and the second nanosheet stack 104 can be patterned in a process referred to as nanosheet patterning. In some embodiments, portions of the first nanosheet stack 102 and the second nanosheet stack 104 are removed to expose a surface of the substrate 106, which is then recessed to define a cavity (not separately shown). A shallow trench isolation (STI) region 122 can be formed by refilling the cavity with dielectrics.

Figures 2A, 2B:
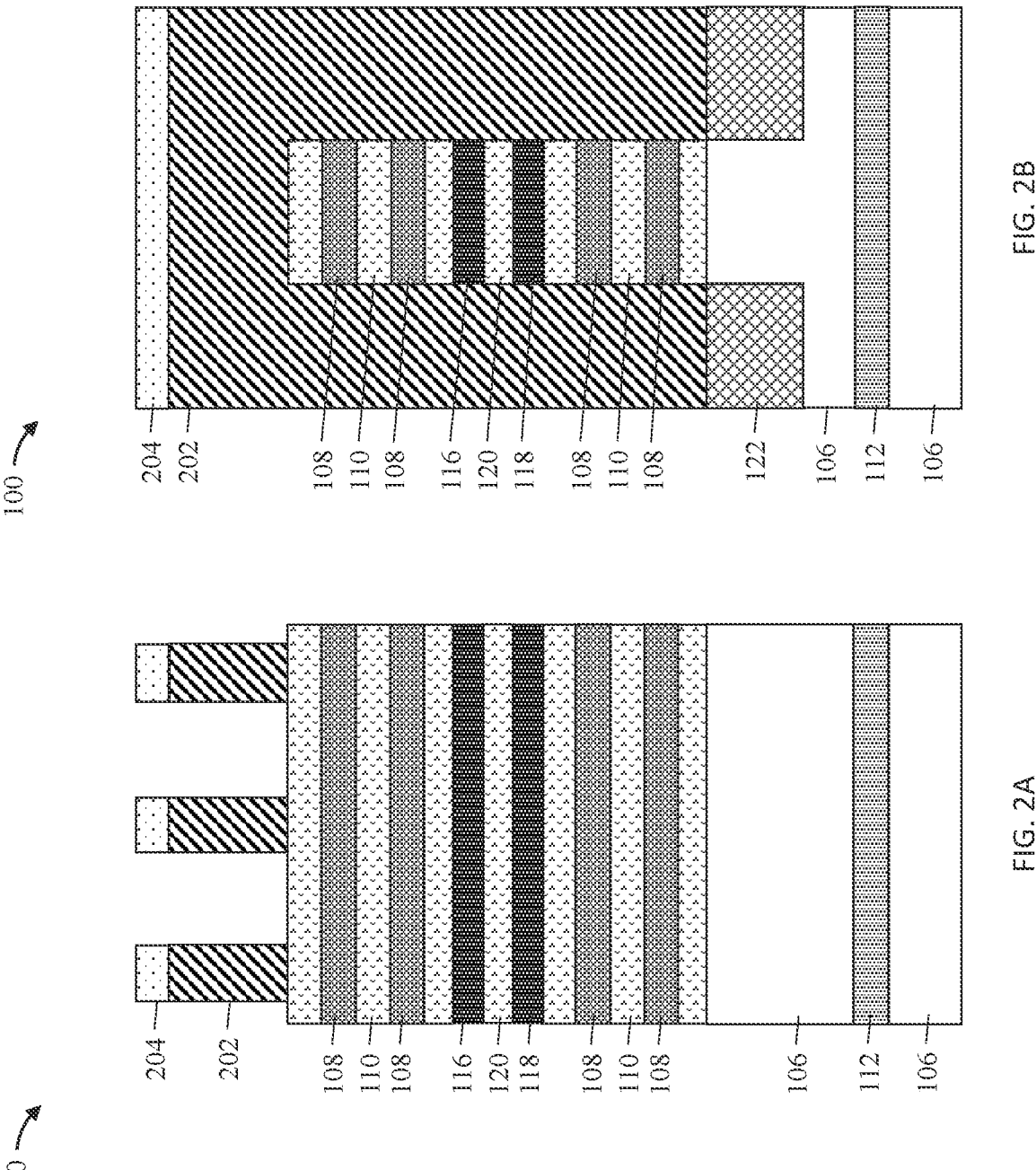
FIG. 2A depicts an across-gate cross-sectional view of the semiconductor wafer after a processing operation according to one or more embodiments of the invention.
FIG. 2B depicts an along-gate cross-sectional view of the semiconductor wafer of FIG. 2A after the processing operation according to one or more embodiments of the invention.

FIGS. 2A and 2B depict across-gate, and along-gate cross-sectional views, respectively, of the semiconductor wafer 100 after a processing operation according to one or more embodiments. As shown in FIGS. 2A and 2B, a sacrificial gate 202 (sometimes referred to as a dummy gate) is formed and patterned over channel regions of the first nanosheet stack 102 and the second nanosheet stack 104. As used herein, a "channel region" refers to a portion of a nanosheet over which a conductive gate (described in further detail later) is formed, and through which current passes from source to drain in the final device. The sacrificial gate 202 can be made of any suitable material, such as, for example, amorphous silicon or polysilicon. Any known method for patterning a sacrificial gate can be used, such as, for example, a wet etch, a dry etch, or a combination of sequential wet and/or dry etches. In some embodiments, a hard mask 204 is formed on the sacrificial gate 202. The hard mask 204 can be made of any suitable materials, such as, for example, silicon nitride.

Figures 3A, 3B:
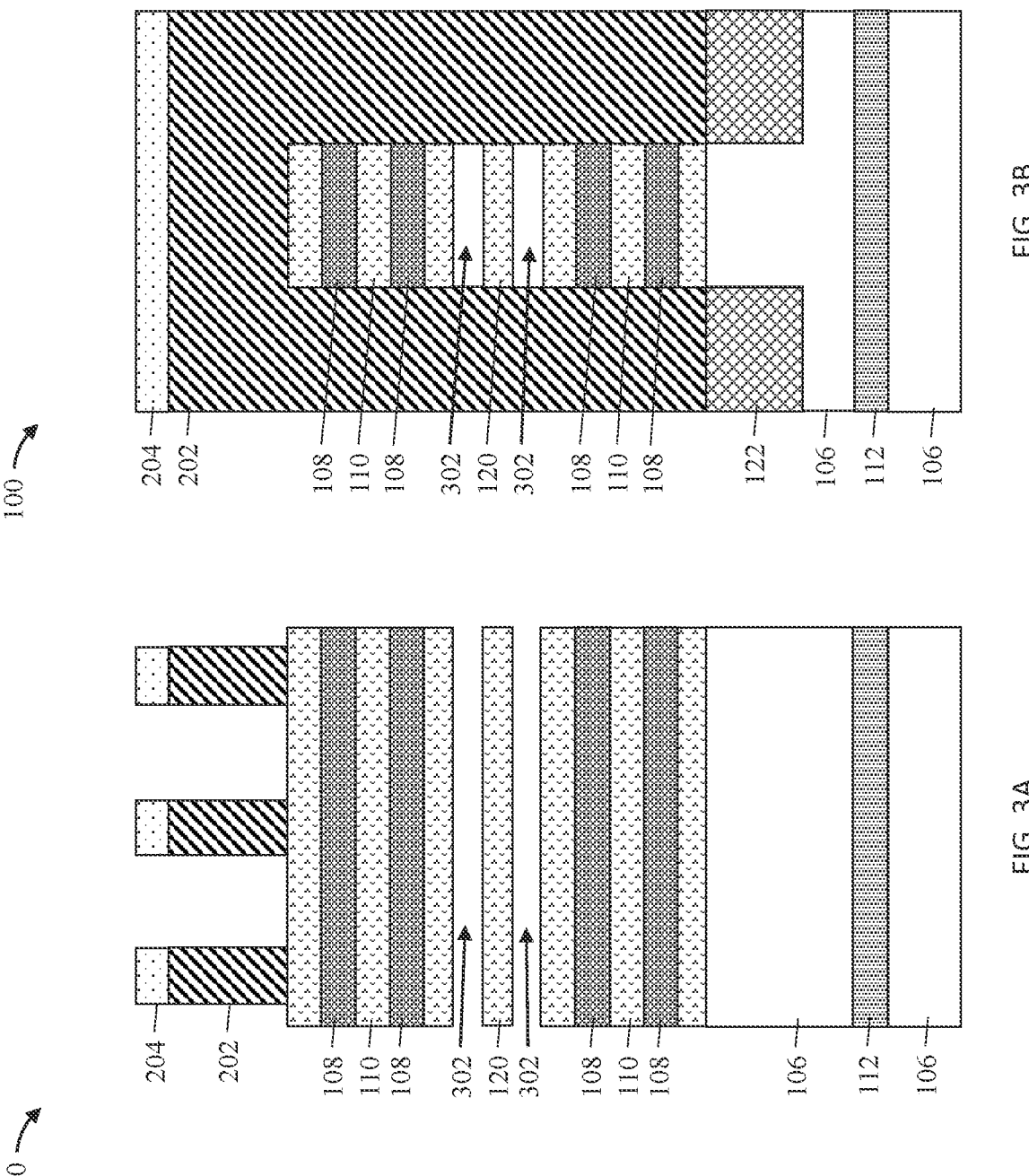
FIG. 3A depicts an across-gate cross-sectional view of the semiconductor wafer after a processing operation according to one or more embodiments of the invention.
FIG. 3B depicts an along-gate cross-sectional view of the semiconductor wafer of FIG. 3A after the processing operation according to one or more embodiments of the invention.

FIGS. 3A and 3B depict across-gate, and along-gate cross-sectional views, respectively, of the semiconductor wafer 100 after a processing operation according to one or more embodiments. As shown in FIGS. 3A and 3B, the top sacrificial layer 116 and the bottom sacrificial layer 118 are removed to define cavities 302. The top sacrificial layer 116 and the bottom sacrificial layer 118 can be removed using, for example, a wet etch, a dry etch, or a combination of sequential wet and/or dry etches. In some embodiments, the top sacrificial layer 116 and the bottom sacrificial layer 118 are removed selective to the nanosheets 108, the sacrificial layers 110, and the middle sacrificial layer 120.

Figures 4A, 4B:
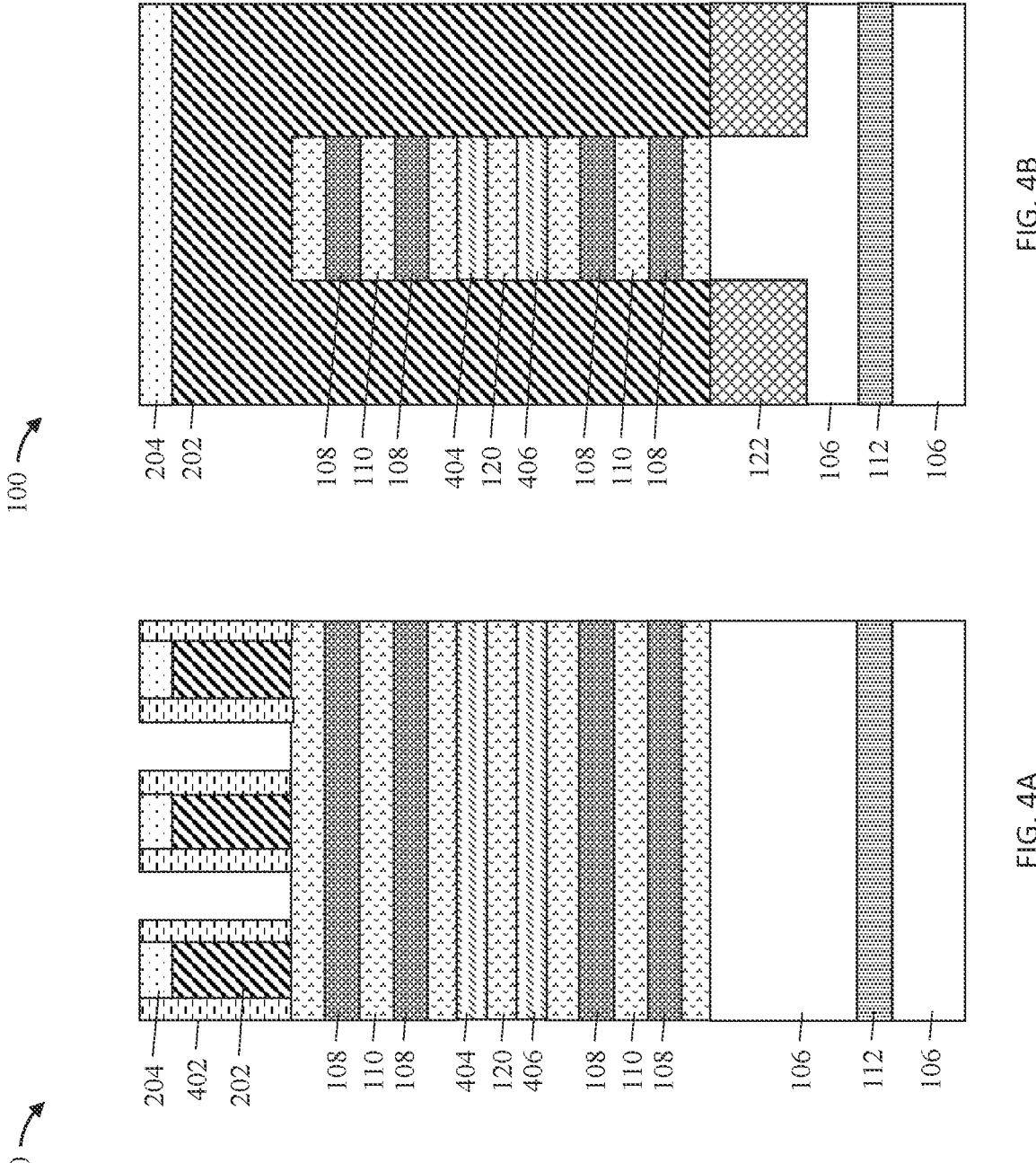
FIG. 4A depicts an across-gate cross-sectional view of the semiconductor wafer after a processing operation according to one or more embodiments of the invention.
FIG. 4B depicts an along-gate cross-sectional view of the semiconductor wafer of FIG. 4A after the processing operation according to one or more embodiments of the invention.

FIGS. 4A and 4B depict across-gate, and along-gate cross-sectional views, respectively, of the semiconductor wafer 100 after a processing operation according to one or more embodiments. As shown in FIG. 4A, gate spacers 402 are formed on sidewalls of the sacrificial gate 202. This process can be referred to as the gate spacer module. The gate spacers 402 can be made of any suitable dielectric material, such as, for example, silicon oxide, silicon nitride, silicon carbide, hydrogenated silicon carbonitrides, silicon oxynitrides, and silicon borocarbonitrides, although other dielectrics are within the contemplated scope of this disclosure. In some embodiments, spacer material is deposited over the semiconductor wafer 100 and patterned using an anisotropic etch, for example, a reactive ion etch (RIE).

As shown in FIGS. 4A and 4B, the cavities 302 are filled with dielectrics during the gate spacer module, defining a top MDI layer 404 and a bottom MDI layer 406. The top MDI layer 404 and a bottom MDI layer 406 together define a bi-layer MDI separation for the first nanosheet stack 102 and the second nanosheet stack 104.

Figures 5A, 5B:
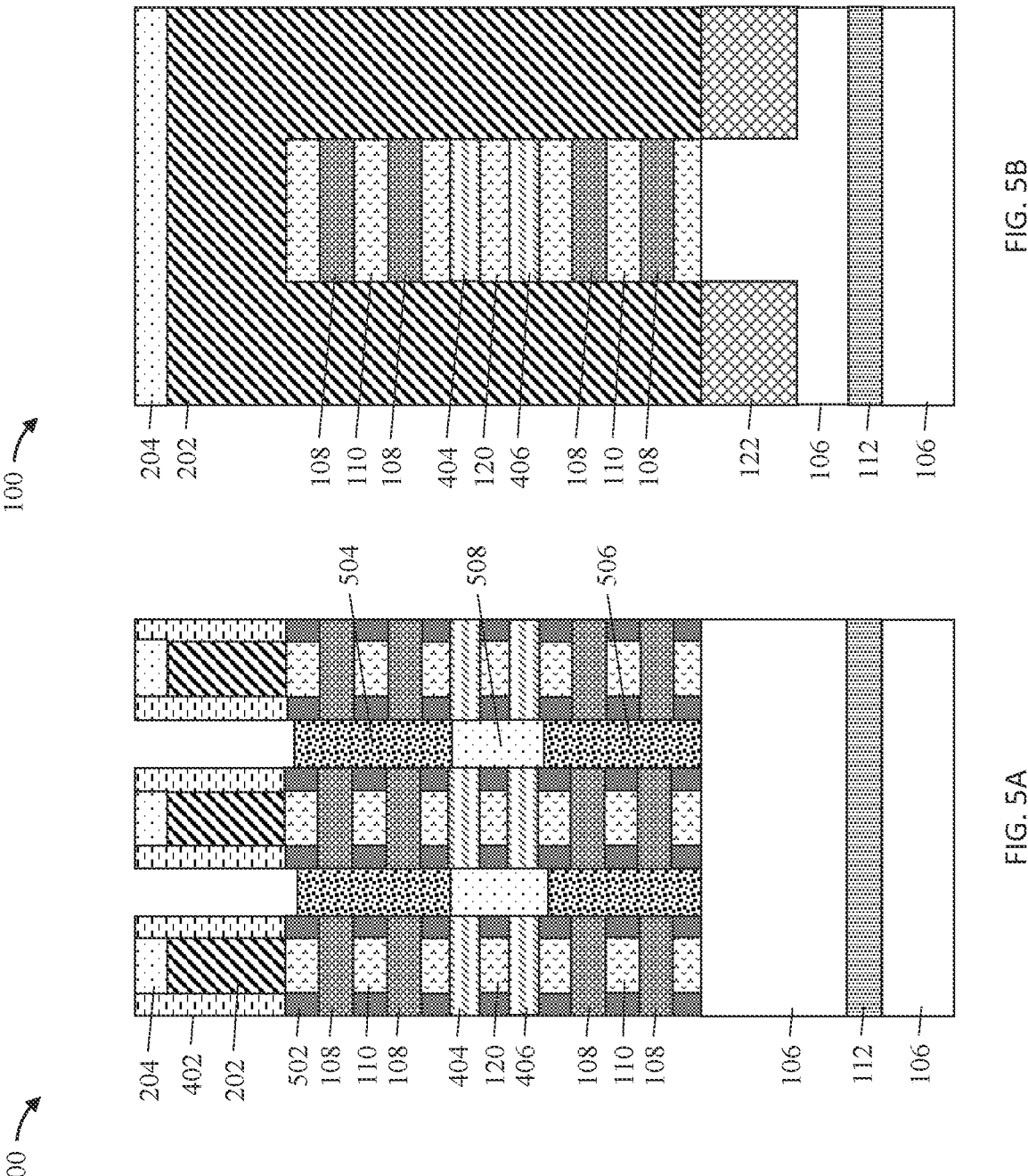
FIG. 5A depicts an across-gate cross-sectional view of the semiconductor wafer after a processing operation according to one or more embodiments of the invention.
FIG. 5B depicts an along-gate cross-sectional view of the semiconductor wafer of FIG. 5A after the processing operation according to one or more embodiments of the invention.

FIGS. 5A and 5B depict across-gate, and along-gate cross-sectional views, respectively, of the semiconductor wafer 100 after a processing operation according to one or more embodiments. As shown in FIG. 5A, FEOL fabrication processes are used to form inner spacers 502, top source/drain regions 504, bottom source/drain regions 506, and a middle ILD 508 between the top source/drain regions 504 and the bottom source/drain regions 506.

In some embodiments, the first nanosheet stack 102 and the second nanosheet stack 104 are recessed, the sacrificial layers 110, 120 are recessed, and the inner spacers 502 are formed in the recess. In some embodiments, the sacrificial layers 110, 120 are recessed selective to the nanosheets 108.

In some embodiments, the bottom source/drain regions 506 are epitaxially grown or otherwise formed on an exposed surface of the substrate 106 after recessing the first nanosheet stack 102 and the second nanosheet stack 104. In addition, or alternatively, the bottom source/drain regions 506 can be epitaxially grown from exposed sidewalls of the nanosheets 108.

In some embodiments, the middle ILD 508 is deposited or otherwise formed on the bottom source/drain regions 506. The middle ILD 508 can be made of any suitable dielectric material, such as, for example, oxides, a low-k dielectric, nitrides, silicon nitride, silicon oxide, SiON, SiC, SiOCN, and SiBCN.

In some embodiments, the top source/drain regions 504 are formed on a surface of the middle ILD 508. In some embodiments, the top source/drain regions 504 can be epitaxially grown from exposed sidewalls of the nanosheets 108.

Advantageously, due to the bi-layer MDI separation constructed in accordance with one or more embodiments, it is straightforward to achieve a height H of the middle ILD 508 (i.e., the distance between the top source/drain regions 504 and the bottom source/drain regions 506) of greater than 10 nanometers, allowing for variations in epitaxial growth thickness and ILD etch back rates without causing structural or electrical defects.

Figures 6A, 6B:
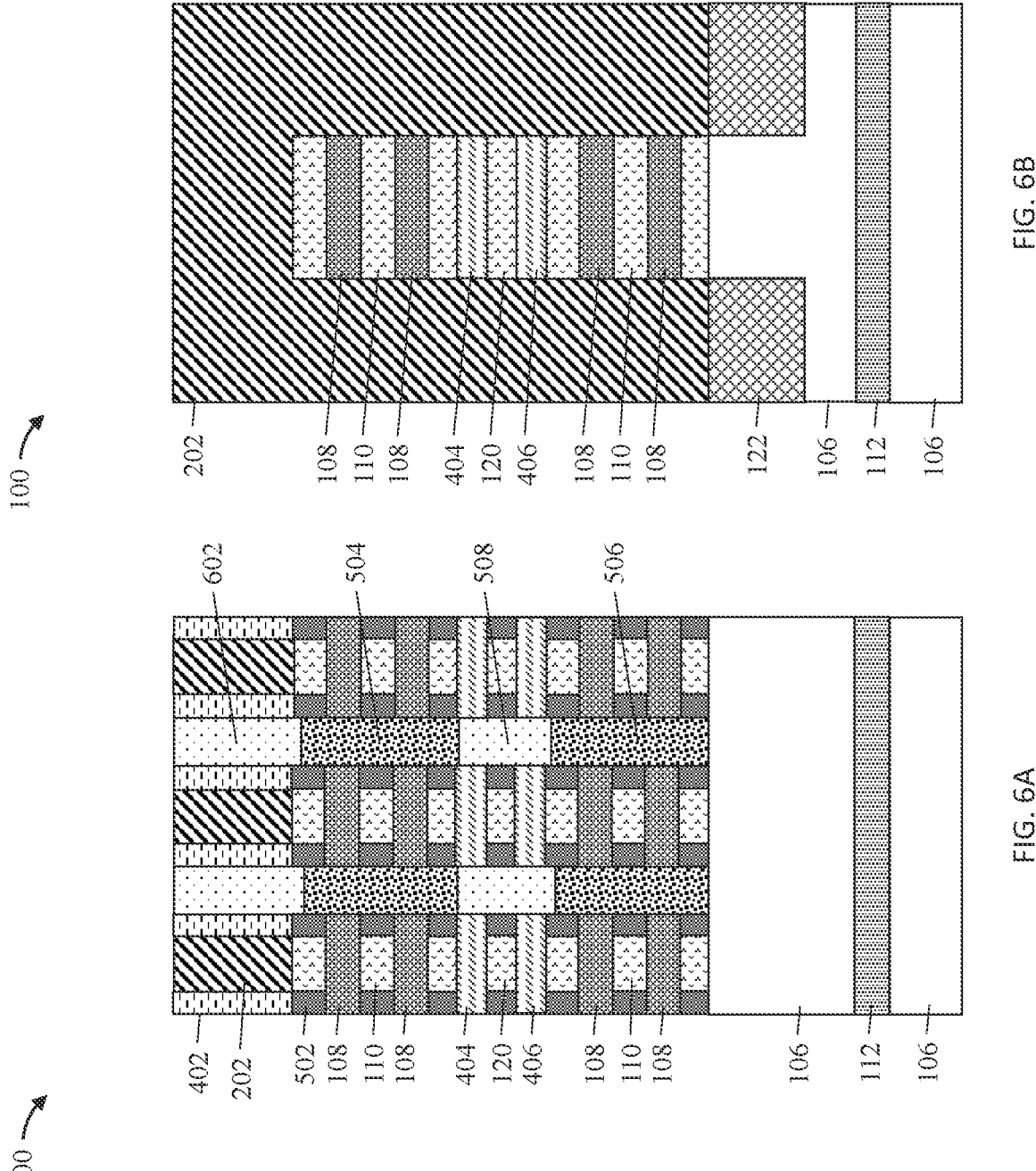
FIG. 6A depicts an across-gate cross-sectional view of the semiconductor wafer after a processing operation according to one or more embodiments of the invention.
FIG. 6B depicts an along-gate cross-sectional view of the semiconductor wafer of FIG. 6A after the processing operation according to one or more embodiments of the invention.

FIGS. 6A and 6B depict across-gate, and along-gate cross-sectional views, respectively, of the semiconductor wafer 100 after a processing operation according to one or more embodiments. As shown in FIG. 6A, an ILD 602 is deposited or otherwise formed over the top source/drain regions 504. The ILD 602 can be made of any suitable dielectric material, such as, for example, oxides, a low-k dielectric, nitrides, silicon nitride, silicon oxide, SiON, SiC, SiOCN, and SiBCN.

As shown in FIGS. 6A and 6B, the semiconductor wafer 100 can be polished (planarized) to remove the hard mask 204. The semiconductor wafer 100 can be polished using any suitable method, such as, for example, chemical mechanical planarization (CMP). In some embodiments, the semiconductor wafer 100 can be polished to a surface of the sacrificial gate 202.

Figures 7A, 7B:
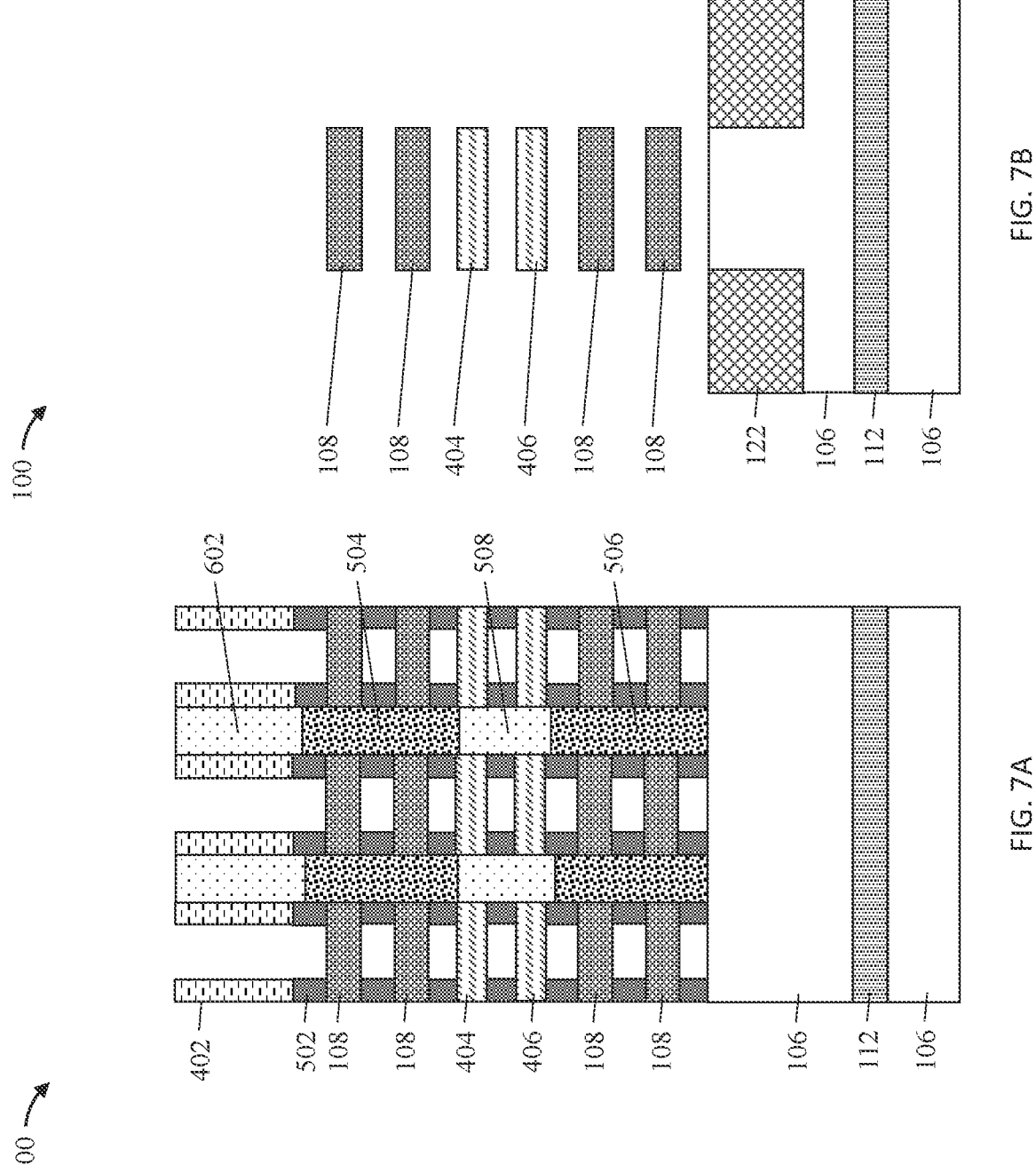
FIG. 7A depicts an across-gate cross-sectional view of the semiconductor wafer after a processing operation according to one or more embodiments of the invention.
FIG. 7B depicts an along-gate cross-sectional view of the semiconductor wafer of FIG. 7A after the processing operation according to one or more embodiments of the invention.

FIGS. 7A and 7B depict across-gate, and along-gate cross-sectional views, respectively, of the semiconductor wafer 100 after a processing operation according to one or more embodiments. As shown in FIG. 7A, the sacrificial gate 202 and the sacrificial layers 110, 120 are removed to release the nanosheets 108. The sacrificial gate 202 can be removed using a wet etch, a dry etch, or a combination of sequential wet and/or dry etches.

The sacrificial layers 110, 120 can be removed selective to the nanosheets 108. For example, when the nanosheets 108 are formed of silicon and the sacrificial layers 110, 120 are formed of silicon germanium, hydrogen chloride (HCl) gas, or an aqueous solution containing a mix of ammonia and hydrogen peroxide, can be utilized to remove silicon germanium selective to silicon. In another example, when the nanosheets 108 are formed of silicon germanium and the sacrificial layers 110, 120 are formed of silicon, aqueous hydroxide chemistry, including ammonium hydroxide and potassium hydroxide, can be utilized to remove silicon selective to silicon germanium.

Figures 8A, 8B:
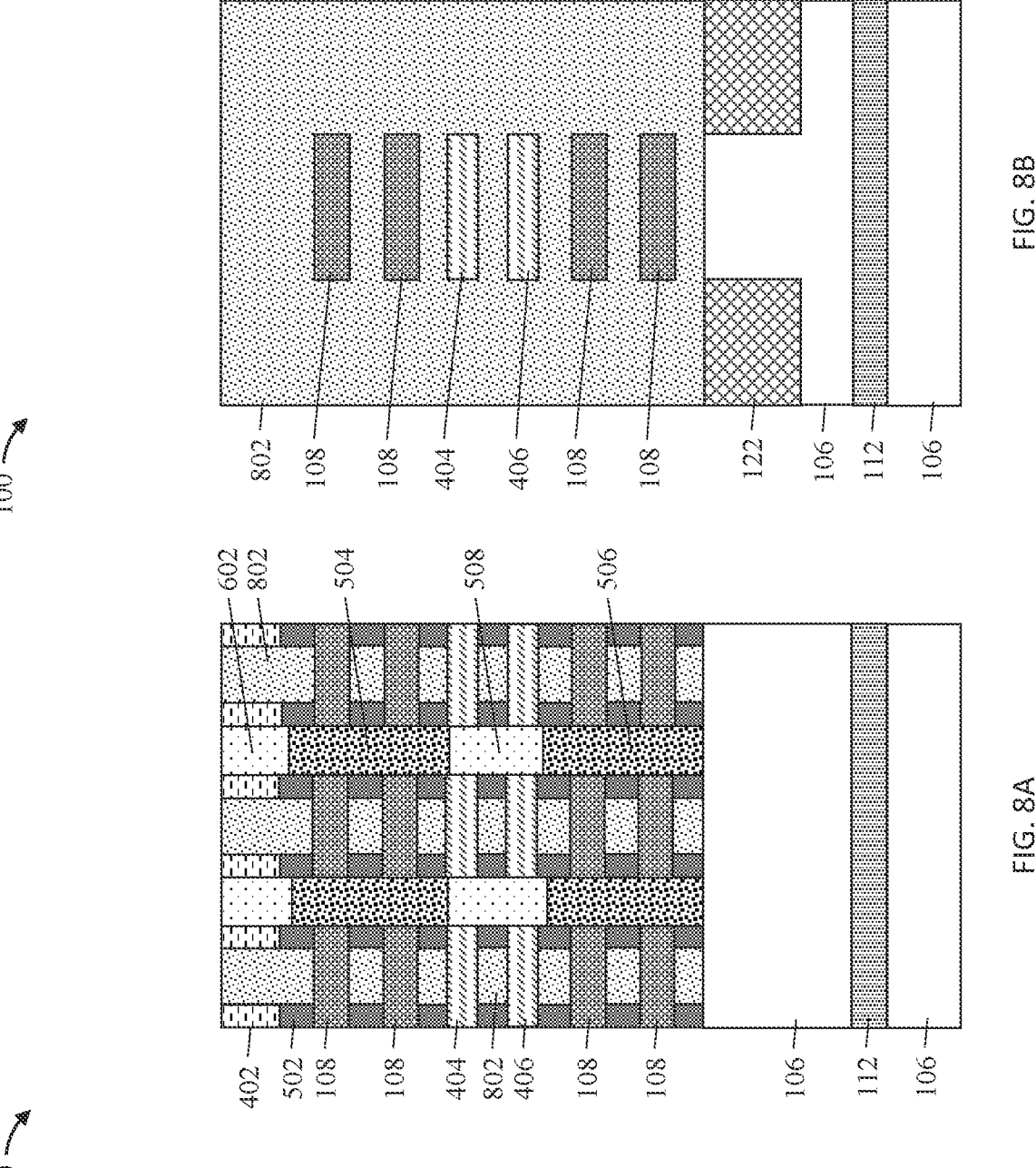
FIG. 8A depicts an across-gate cross-sectional view of the semiconductor wafer after a processing operation according to one or more embodiments of the invention.
FIG. 8B depicts an along-gate cross-sectional view of the semiconductor wafer of FIG. 8A after the processing operation according to one or more embodiments of the invention.

FIGS. 8A and 8B depict across-gate, and along-gate cross-sectional views, respectively, of the semiconductor wafer 100 after a processing operation according to one or more embodiments. As shown in FIGS. 8A and 8B, the removed sacrificial gate 202 (FIG. 7A) can be replaced with a conductive gate 802.

The conductive gate 802 can be a high-k metal gate (HKMG) formed over channel regions of the first nanosheet stack 102 and the second nanosheet stack 104 using, for example, known replacement metal gate (RMG) processes, or so-called gate-last processes. In some embodiments, the conductive gate 802 can include a gate dielectric and a work function metal stack (not separately depicted). While shown as a single gate (i.e., a common gate stack) for ease of illustration and discussion, it should be understood that the conductive gate 802 can include separate gate portions for the first nanosheet stack 102 and the second nanosheet stack 104. That is, in some embodiments, each gate portion can be electrically isolated from the other(s) using, e.g., one or more interlayer dielectric layers (not separately shown).

In some embodiments, the gate dielectric is a high-k dielectric film formed on a surface (sidewall) of the nanosheets 108. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of this disclosure.

The work function metal stack, if present, can include one or more work function layers positioned between the high-k dielectric film and a bulk gate material. In some embodiments, the conductive gate 802 includes one or more work function layers, but does not include a bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the conductive gate 802 and enables tuning of the device threshold voltage. The work function layers can be formed to a thickness of about 0.5 to 6 nm, although other thicknesses are within the contemplated scope of this disclosure. In some embodiments, each of the work function layers can be formed to a different thickness.

In some embodiments, the conductive gate 802 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate materials can further include dopants that are incorporated during or after deposition.

Figures 9A, 9B:
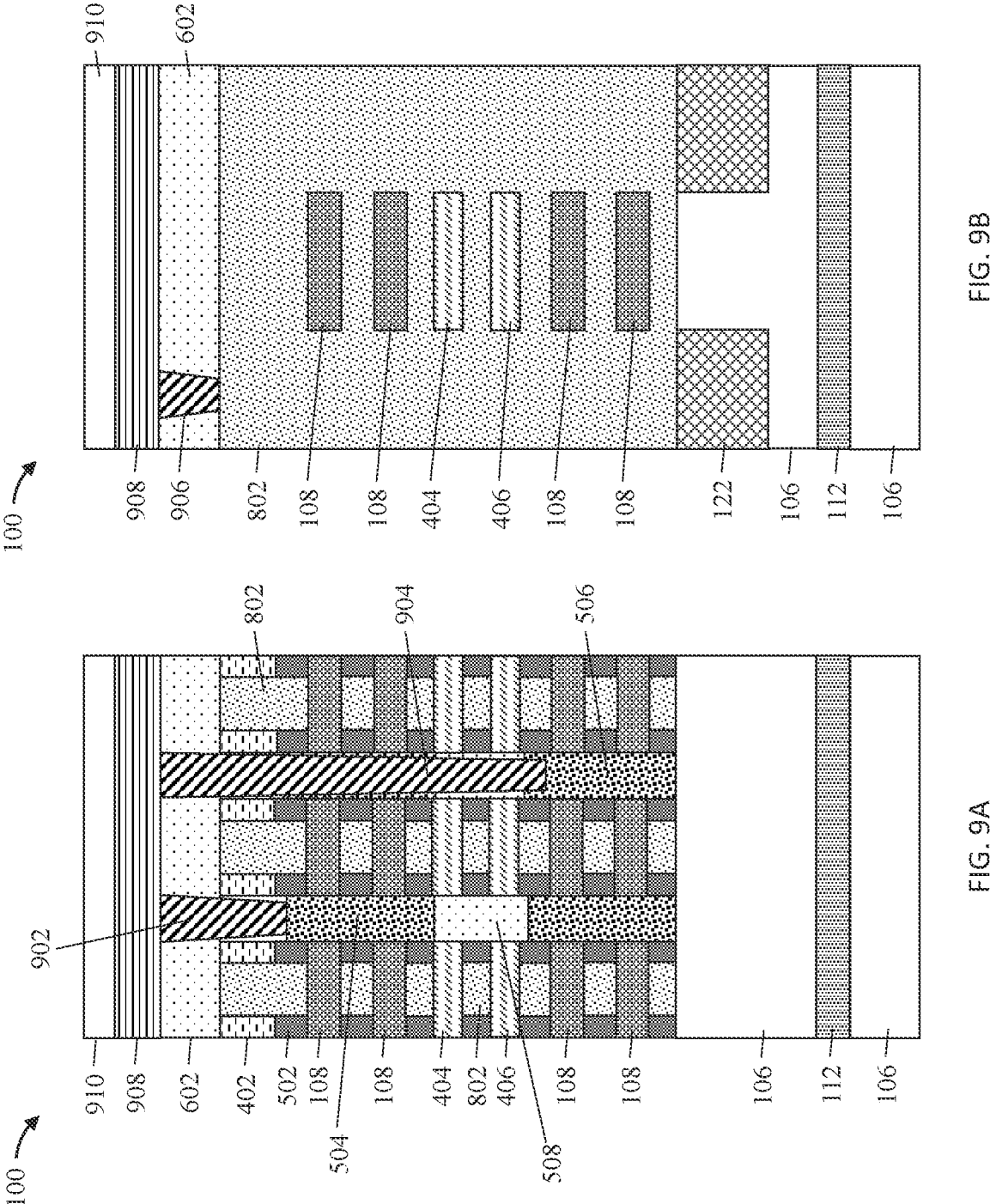
FIG. 9A depicts an across-gate cross-sectional view of the semiconductor wafer after a processing operation according to one or more embodiments of the invention.
FIG. 9B depicts an along-gate cross-sectional view of the semiconductor wafer of FIG. 9A after the processing operation according to one or more embodiments of the invention.

FIGS. 9A and 9B depict across-gate, and along-gate cross-sectional views, respectively, of the semiconductor wafer 100 after a processing operation according to one or more embodiments. As shown in FIGS. 9A and 9B, known FEOL and MOL fabrication operations are used to extend the ILD 602 with the same or different dielectrics and to form contacts (e.g., the contact 902, sometimes referred to as the top epitaxy contact or the shallow contact, the contact 904, sometimes referred to as the common epitaxy contact or the deep contact, and the gate contact 906) to various device substructures. As further shown in FIGS. 9A and 9B, known BEOL fabrication operations are used to form a BEOL interconnect 908 over the semiconductor wafer 100 and to bond a carrier wafer 910 to the semiconductor wafer 100.

Figures 10A, 10B:
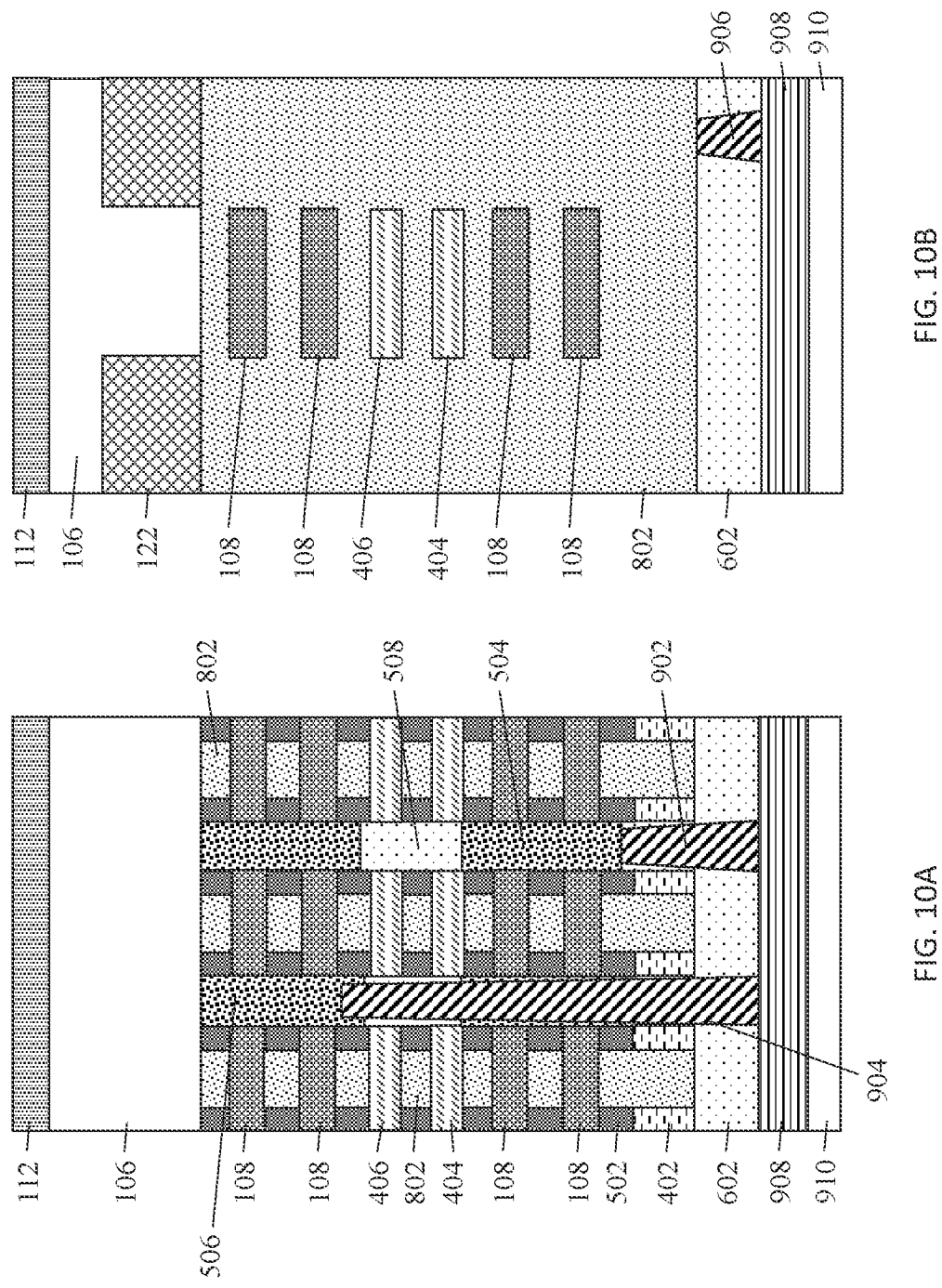
FIG. 10A depicts an across-gate cross-sectional view of the semiconductor wafer after a processing operation according to one or more embodiments of the invention.
FIG. 10B depicts an along-gate cross-sectional view of the semiconductor wafer of FIG. 10A after the processing operation according to one or more embodiments of the invention.

FIGS. 10A and 10B depict across-gate, and along-gate cross-sectional views, respectively, of the semiconductor wafer 100 after a processing operation according to one or more embodiments. As shown in FIGS. 10A and 10B, the semiconductor wafer 100 can be flipped for backside processing. In some embodiments, portions of the substrate 106 are removed to expose the buried oxide layer 112. In some embodiments, the substrate 106 is recessed using a selective process that stops on the buried oxide layer 112.

Figures 11A, 11B:
FIG. 11A depicts an across-gate cross-sectional view of the semiconductor wafer after a processing operation according to one or more embodiments of the invention.
FIG. 11B depicts an along-gate cross-sectional view of the semiconductor wafer of FIG. 11A after the processing operation according to one or more embodiments of the invention.

FIGS. 11A and 11B depict across-gate, and along-gate cross-sectional views, respectively, of the semiconductor wafer 100 after a processing operation according to one or more embodiments. As shown in FIGS. 11A and 11B, the buried oxide layer 112 and remaining portions of the substrate 106 are removed to expose the underlying structures (e.g., the bottom source/drain regions 506, the conductive gate 802, the STI region 122, etc.). The buried oxide layer 112 and remaining portions of the substrate 106 can be removed using a wet etch, a dry etch, or a combination of sequential wet and/or dry etches.

Figures 12A, 12B:
FIG. 12A depicts an across-gate cross-sectional view of the semiconductor wafer after a processing operation according to one or more embodiments of the invention.
FIG. 12B depicts an along-gate cross-sectional view of the semiconductor wafer of FIG. 12A after the processing operation according to one or more embodiments of the invention.

FIGS. 12A and 12B depict across-gate, and along-gate cross-sectional views, respectively, of the semiconductor wafer 100 after a processing operation according to one or more embodiments. As shown in FIGS. 12A and 12B, a backside interlayer dielectric (BILD) 1202 is formed over the semiconductor wafer 100. The BILD 1202 can be formed of similar dielectrics and in a similar manner as the middle ILD 508 discussed previously with respect to FIG. 5. In some embodiments, a backside contact 1204 (sometimes referred to as the bottom epitaxy contact) is formed or otherwise embedded in the BILD 1202 to land on or in the bottom source/drain regions 506.

As further shown in FIGS. 12A and 12B, a backside interconnect 1206 is formed over the BILD 1202 and the backside contact 1204. The backside interconnect 1206 can be formed using various BEOL processes, in a similar manner as the interconnect 908 discussed previously with respect to FIG. 9.

After backside processing is complete, the semiconductor wafer 100 can be finalized using known processes (e.g., additional BEOL processing, including the incorporation of additional M$_x$ metallization layers, far back end of line (FBEOL) processing, packaging module(s), etc.) to define a final device.

Figure 13:
FIG. 13 depicts a flow diagram illustrating a method according to one or more embodiments of the invention.
Figure 13:
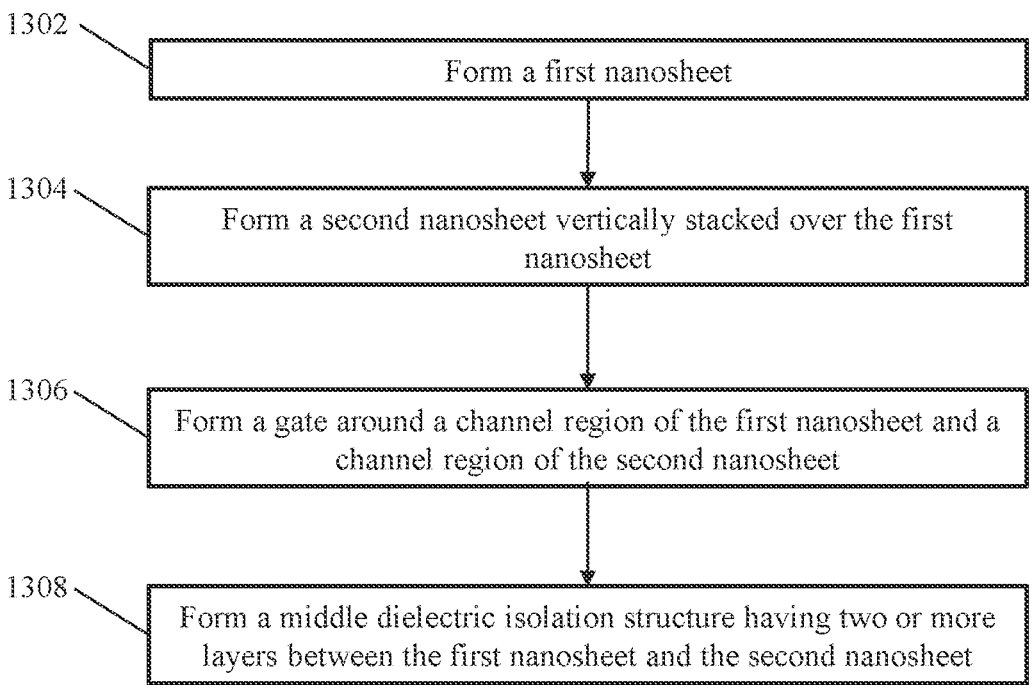

FIG. 13 depicts a flow diagram illustrating a method 1300 for providing a monolithic SFET having a dual MDI separation according to one or more embodiments of the invention. As shown at block 1302, a first nanosheet is formed. At block 1304, a second nanosheet is vertically stacked over the first nanosheet. In some embodiments, the semiconductor device is a stacked field effect transistor.

In some embodiments, the method includes forming a first nanosheet stack that includes the first nanosheet and one or more additional nanosheets and forming a second nanosheet stack that includes the second nanosheet and one or more additional nanosheets. In some embodiments, the stacked field effect transistor is a complementary stacked field effect transistor including an nFET and a pFET. In some embodiments, the first nanosheet stack defines a portion of one of the nFET and the pFET and the second nanosheet stack defines a portion of the other one of the nFET and the pFET.

At block 1306, a gate is formed around a channel region of the first nanosheet and a channel region of the second nanosheet. In some embodiments, the gate is a common gate of the stacked field effect transistor. In some embodiments, the gate includes a first portion (i.e., a first gate) and a second portion (i.e., a second gate) electrically isolated from the first portion. In some embodiments, the first portion serves as a gate for the first nanosheet and the second portion serves as a separate gate for the second nanosheet.

At block 1308, a middle dielectric isolation structure is formed between the first nanosheet and the second nanosheet. The middle dielectric isolation structure includes at least a first middle dielectric isolation layer and a second middle dielectric isolation layer vertically stacked over the first middle dielectric isolation layer. In some embodiments, a portion of the gate extends between the first middle dielectric isolation layer and the second middle dielectric isolation layer in the middle dielectric isolation structure. In some embodiments, a thickness of the first middle dielectric isolation layer and a thickness of the second middle dielectric isolation layer is less than or equal to 10 nanometers.

The method can further include forming a first source or drain region in direct contact with sidewalls of the first nanosheet and forming a second source or drain region in direct contact with sidewalls of the second nanosheet. In some embodiments, a middle interlayer dielectric is formed between the first source or drain region and the second source or drain region. In some embodiments, the middle interlayer dielectric is in direct contact with sidewalls of the first middle dielectric isolation layer and sidewalls of the second middle dielectric isolation layer. In some embodiments, the first source or drain region includes a first doping type and the second source or drain region includes a second doping type opposite the first doping type.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a first nanosheet;

forming a second nanosheet vertically stacked over the first nanosheet;

forming a gate around a channel region of the first nanosheet and a channel region of the second nanosheet; and forming a middle dielectric isolation structure between the first nanosheet and the second nanosheet, the middle dielectric isolation structure comprising:

a first middle dielectric isolation layer; and a second middle dielectric isolation layer vertically stacked over the first middle dielectric isolation layer;

wherein a portion of the gate extends between the first middle dielectric isolation layer and the second middle dielectric isolation layer in the middle dielectric isolation structure; and wherein forming the middle dielectric isolation structure comprises:

forming a temporary isolation structure between the first nanosheet and the second nanosheet, the temporary isolation structure comprising a top sacrificial layer, a bottom sacrificial layer, and a middle sacrificial layer between the top sacrificial layer and the bottom sacrificial layer, the middle sacrificial layer having a first germanium concentration and the top sacrificial layer and the bottom sacrificial layer having a second germanium concentration higher than the first germanium concentration, thereby providing etch selectivity with respect to the middle sacrificial layer; and replacing the top sacrificial layer and the bottom sacrificial layer with the first middle dielectric isolation layer and the second middle dielectric isolation layer, respectively.

2. The method of claim 1, further comprising:

forming a first nanosheet stack comprising the first nanosheet and one or more additional nanosheets; and

US 12,575,145 B2

17

18 forming a second nanosheet stack comprising the second nanosheet and one or more additional nanosheets.

3. The method of claim 2, wherein the semiconductor device comprises a stacked field effect transistor.

4. The method of claim 3, wherein the gate comprises a common gate of the stacked field effect transistor.

5. The method of claim 4, wherein the stacked field effect transistor comprises a complementary stacked field effect transistor comprising an nFET and a pFET.

6. The method of claim 5, wherein the first nanosheet stack defines a portion of one of the nFET and the pFET and the second nanosheet stack defines a portion of the other one of the nFET and the pFET.

7. The method of claim 1, further comprising:

forming a first source or drain region in direct contact with sidewalls of the first nanosheet; and forming a second source or drain region in direct contact with sidewalls of the second nanosheet.

8. The method of claim 7, further comprising forming a middle interlayer dielectric between the first source or drain region and the second source or drain region, the middle interlayer dielectric in direct contact with sidewalls of the first middle dielectric isolation layer and sidewalls of the second middle dielectric isolation layer.

9. The method of claim 7, wherein the first source or drain region comprises a first doping type and the second source or drain region comprises a second doping type opposite the first doping type.

10. The method of claim 1, wherein a thickness of the first middle dielectric isolation layer and a thickness of the second middle dielectric isolation layer is less than or equal to 10 nanometers.

\* \* \* \* \*